United States Patent
Kang et al.

(10) Patent No.: US 7,795,089 B2
(45) Date of Patent: Sep. 14, 2010

(54) FORMING A SEMICONDUCTOR DEVICE HAVING EPITAXIALLY GROWN SOURCE AND DRAIN REGIONS

(75) Inventors: Laegu Kang, Austin, TX (US); Vishal P. Trivedi, Austin, TX (US); Da Zhang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 766 days.

(21) Appl. No.: 11/680,219

(22) Filed: Feb. 28, 2007

(65) Prior Publication Data

US 2008/0206940 A1 Aug. 28, 2008

(51) Int. Cl.
*H01L 21/8238* (2006.01)
(52) U.S. Cl. .............. 438/226; 257/E21.634
(58) Field of Classification Search ......... 438/226, 438/442, 938; 257/E21.634
See application file for complete search history.

(56) References Cited

U.S. PATENT DOCUMENTS

| | | | |
|---|---|---|---|
| 6,124,614 A | 9/2000 | Ryum et al. | |
| 6,429,061 B1 | 8/2002 | Rim | |
| 6,605,498 B1 | 8/2003 | Murthy et al. | |
| 6,621,131 B2 | 9/2003 | Murthy et al. | |
| 6,861,318 B2 | 3/2005 | Murthy et al. | |
| 7,053,400 B2 | 5/2006 | Sun et al. | |
| 6,573,172 B1 | 2/2007 | En et al. | |
| 2007/0128783 A1* | 6/2007 | Ting et al. | ............ 438/199 |

OTHER PUBLICATIONS

Thompson, Scott E., et al. "A Logic Nanotechnology Featuring Strained-Silicon, IEEE Electron Device Letter," vol. 25, No. 4, Apr. 2004, pp. 191-193.

* cited by examiner

*Primary Examiner*—Chandra Chaudhari
(74) *Attorney, Agent, or Firm*—Kim-Marie Vo; James L. Clingan, Jr.

(57) ABSTRACT

A semiconductor device structure is made on a semiconductor substrate having a semiconductor layer having isolation regions. A first gate structure is formed over a first region of the semiconductor layer, and a second gate structure is over a second region of the semiconductor layer. A first insulating layer is formed over the first and second regions. The first insulating layer can function as a mask during an etch of the semiconductor layer and can be removed selective to the isolation regions and the sidewall spacers. The first insulating layer is removed from over the first region to leave a remaining portion of the first insulating layer over the second region. The semiconductor layer is recessed in the first region adjacent to the first gate to form recesses. A semiconductor material is epitaxially grown in the recesses. The remaining portion of the first insulating layer is removed.

13 Claims, 7 Drawing Sheets

FORMING A SEMICONDUCTOR DEVICE HAVING EPITAXIALLY GROWN SOURCE AND DRAIN REGIONS

BACKGROUND

1. Field

This disclosure relates generally to processes for forming semiconductor devices, and more specifically, to processes for forming a semiconductor device having epitaxially grown source and drain regions.

2. Related Art

Traditional methods for forming semiconductor devices having epitaxially grown source and drain regions involve several hydrofluoric acid cleaning steps, such as "HF clean." For example, taking a p-channel device with epitaxial source/drain regions, as an example, after source/drain recesses are formed, an HF clean process is performed. This step, however, results in a removal of some of the field oxide used as part of isolation regions and the oxide used to mask the n-channel devices. Moreover, subsequent removal of the oxide mask used to mask the n-channel devices using an HF cleaning process results in further removal of field oxide used as part of the isolation regions. This undesirable removal of field oxide can have several deleterious effects. For example, when dual etch-stop layers are formed to generate compressive or tensile strain in the channel regions of the semiconductor device, the loss of field oxide can cause unfavorable stress alignment from the dual etch-stop layers. Furthermore, the loss of field oxide in the isolation regions also can cause lower stress from the isolation regions.

Accordingly, there is a need for processes for forming a semiconductor device having epitaxially grown source and drain regions.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
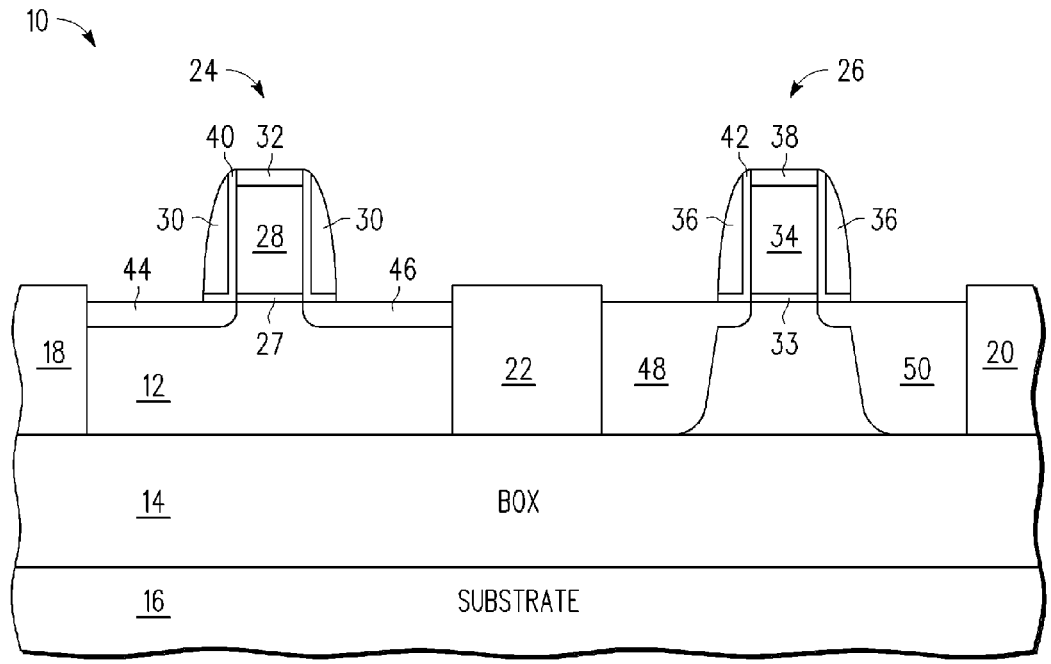
FIG. 1 is a view of a semiconductor device during a processing stage.

In one aspect, a method of making a semiconductor device structure on a semiconductor substrate having a semiconductor layer having isolation regions is provided. The method includes forming a first gate structure over a first region of the semiconductor layer and a second gate structure over a second region of the semiconductor layer. The method further includes forming sidewall spacers along sidewalls of the first and second gates. The method further includes forming a first insulating layer over the first and second regions in which the first insulating layer can function as a mask during an etch of the semiconductor layer and can be removed selective to the isolation regions and the sidewall spacers. The method further includes removing the first insulating layer from over the first region to leave a remaining portion of the first insulating layer over the second region. The method further includes recessing the semiconductor layer in the first region adjacent to the first gate to form recesses. The method further includes epitaxially growing a semiconductor material in the recesses. The method further includes removing the remaining portion of the of the first insulating layer.

In another aspect, a method of forming a semiconductor device is provided. The method includes providing a semiconductor substrate having a semiconductor layer. The method further includes forming a first gate in a first region and a second gate in a second region, wherein the first region is separated from the second region by an isolation region comprising a first material. The method further includes forming sidewall spacers of a second material different from the first material along sidewalls of the first and second gates. The method further includes forming a first insulating layer over the first and second regions, wherein the first insulating layer can be etched selectively to the first material and the second material. The method further includes forming a second insulating layer over the first insulating layer, wherein the second insulating layer can be etched selective to the first insulating layer and the semiconductor layer can be etched selective to the second insulating layer. The method further includes patterning the second insulating layer to leave a remaining portion of the second insulating layer over the second region. The method further includes patterning the first insulating layer to leave a remaining portion of the first insulating layer over the second region. The method further includes recessing the semiconductor layer in the first region adjacent to the first gate to form recesses. The method further includes epitaxially growing a semiconductor material in the recesses. The method further includes removing the remaining portion of the of the second insulating layer. The method further includes removing the remaining portion of the first insulating layer.

In yet another aspect, a method of making a semiconductor device structure on a semiconductor substrate having a silicon layer having isolation regions comprising silicon oxide is provided. The method includes forming a first gate structure over a first region of the silicon layer and a second gate structure over a second region of the silicon layer wherein the first region is for forming a transistor type different from a transistor type formed in the second region. The method further includes forming nitride sidewall spacers along sidewalls of the first and second gates. The method further includes forming a first insulating layer over the first and second regions in which silicon can be etched selective to the first insulating layer and the first insulating layer can be etched selective to silicon oxide and nitride. The method further includes removing the first insulating layer from over the first region to leave a remaining portion of the first insulating layer over the second region. The method further includes recessing the semiconductor layer in the first region adjacent to the first gate to form recesses. The method further includes epitaxially growing a semiconductor material comprising one of a group consisting of silicon carbon and silicon germanium in the recesses. The method further includes removing the remaining portion of the first insulating layer.

FIG. 1 shows a view of a semiconductor device 10 during a processing step. Semiconductor device 10 may comprise a device formed using semiconductor material 12 on a buried oxide layer (BOX) 14, over a substrate 16. The semiconductor material 12 described herein can be any semiconductor material or combinations of materials, such as gallium arsenide, silicon germanium, silicon, the like, and combinations of the above. Although FIG. 1 shows a SOI implementation, semiconductor device 10 may be formed over bulk substrate, as well. Semiconductor device 10 may include a p-channel region 24 and an n-channel region 26 separated by isolation region 22. Isolation region 22 may be formed using field oxide. Additional isolation regions 18 and 20 may also be formed to isolate adjacent devices. Isolation regions 18 and 20 may be formed using field oxide. A p-channel device may be formed in p-channel region 24 and an n-channel device may be formed in n-channel region 26. P-channel device may include a gate electrode 28 formed over a gate dielectric layer 27. A spacer 30 may be formed adjacent to gate electrode 28. By way of example, spacer 30 may be a nitride spacer. A capping layer 32 may be formed over gate electrode 28. Capping layer 32 may also be a nitride capping layer. A liner 40 may be formed between spacer 30 and gate electrode 28. Liner 40 may be an oxide liner. Source/drain extension regions 44, 46 may be formed as part of p-channel device, as well. Similarly, n-channel device may include a gate electrode 34 over a gate dielectric layer 33. Gate electrodes 28 and 34 may be formed using polysilicon or metal or they may be a combination of polysilicon and metal and may be a stack formed of suitable materials. A spacer 36 may be formed adjacent to gate electrode 34. By way of example, spacer 36 may be a nitride spacer. A capping layer 38 may be formed over gate electrode 34. Capping layer 38 may also be a nitride capping layer. A liner 42 may be formed between spacer 36 and gate electrode 34. Liner 42 may be an oxide liner. Source/drain extension and deep source/drains 48, 50 may be formed as part of n-channel device by implanting suitable dopants. Deep source/drains may be formed at a later stage of the processing, for example, after the removal of epi hard mask 52 at the stage shown in FIG. 11. Although FIG. 1 shows no liner overlying source/drain regions and overlying the top of gate structures, a liner may be present over these regions and structures.

Figure 2:
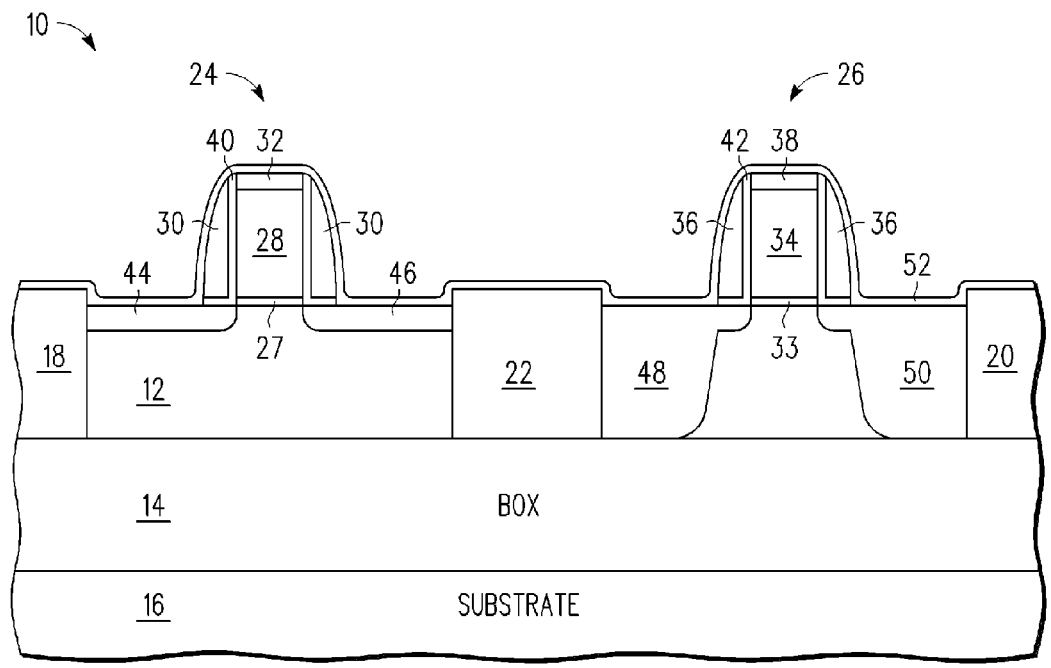
FIG. 2 is a view of a semiconductor device during a processing step.

As shown in FIG. 2, an epi hard mask 52 may be formed over the p-channel and the n-channel devices. Epi hard mask 52 may be formed using a material that has a high resistance with respect to HF clean. In other words, epi hard mask 52 may be formed using a material that has a low etch rate with respect to HF clean. For example, epi hard mask 52 may be formed using a high K material. In one embodiment, epi hard mask 52 may be formed using a material having a dielectric constant greater than the dielectric constant of a material used to form spacers 30 and 36. In one embodiment, epi hard mask 52 may be formed using a material that has a higher dielectric constant higher than an oxide. By way of non-limiting examples, epi hard mask 52 may be formed using metal oxides, such as $HfO_2$ or $Zr\,O_2$, or $HfZr\,O_2$. Other materials that have a high resistance with respect to HF clean, such as TiN and HfN can also be used to form epi hard mask 52. Epi hard mask 52 may be formed using a chemical vapor deposition process, an atomic layer deposition process, or a physical vapor deposition process. Epi hard mask 52 may have thickness in a range of 50 Angstroms to 200 Angstroms.

Figure 3:
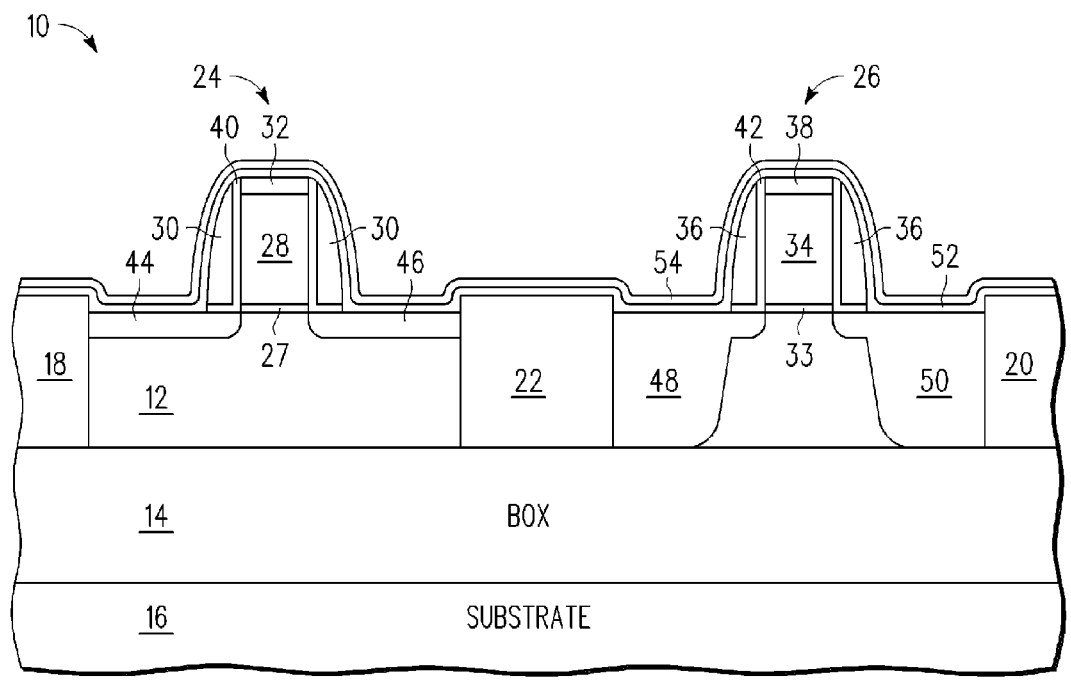
FIG. 3 is a view of a semiconductor device during a processing step.

Next, as shown in FIG. 3, a hard mask 54 may be formed over epi hard mask 52. By way of example, hard mask 54 may be formed using a material such that hard mask 54 can be etched selective to epi hard mask 52. Hard mask 54 may be formed using an oxide, such as undoped silicon oxide. Hard mask 54 may be formed using a plasma enhanced chemical vapor deposition process. Hard mask 54 may have thickness in a range of 50 Angstroms to 200 Angstroms.

Figure 4:
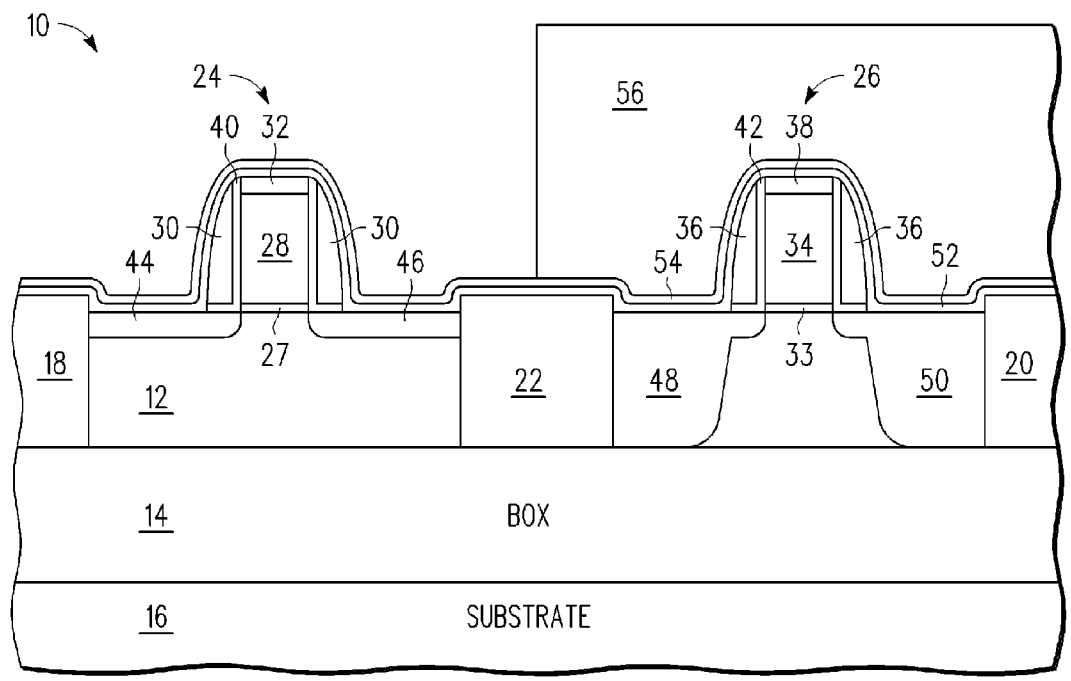
FIG. 4 is a view of a semiconductor device during a processing step.

Next, as shown in FIG. 4, a patterned photoresist layer 56 may be formed over the n-channel device. By way of example, as part of this step, a photoresist layer may be formed overlying hard mask 54, which then may be patterned to leave patterned photoresist layer 56.

Figure 5:
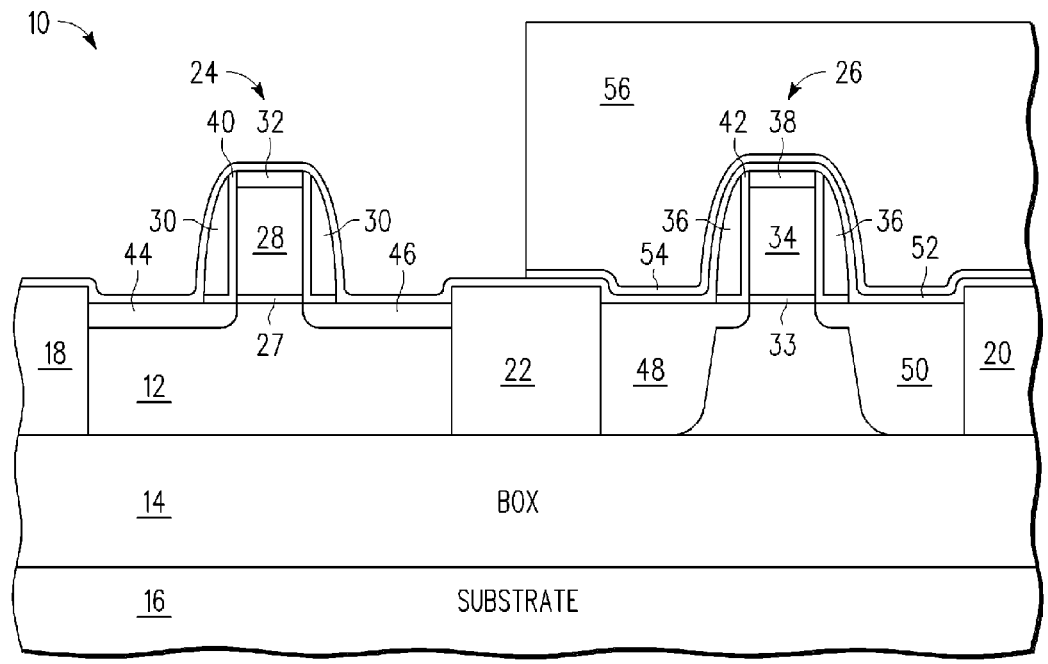
FIG. 5 is a view of a semiconductor device during a processing step.

Next, as shown in FIG. 5, hard mask 54 may be etched away from over the p-channel device. Wet or dry etching may be used as part of this step.

Figure 6:
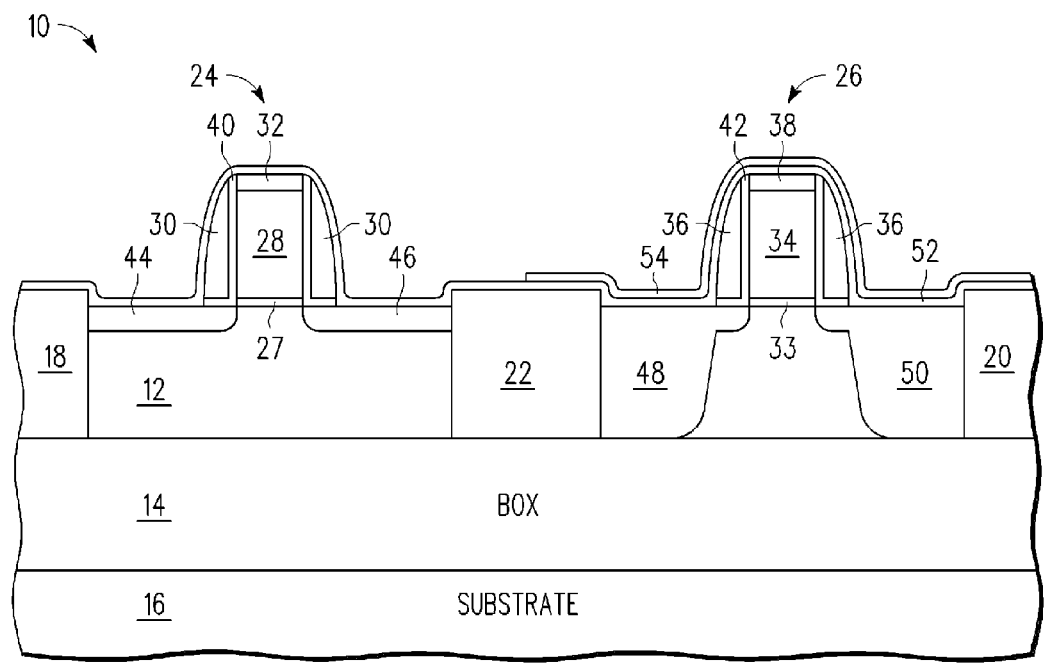
FIG. 6 is a view of a semiconductor device during a processing step.

Next, as shown in FIG. 6, patterned photoresist layer 56 may be removed using a plasma ashing process and a Piranha clean process.

Figure 7:
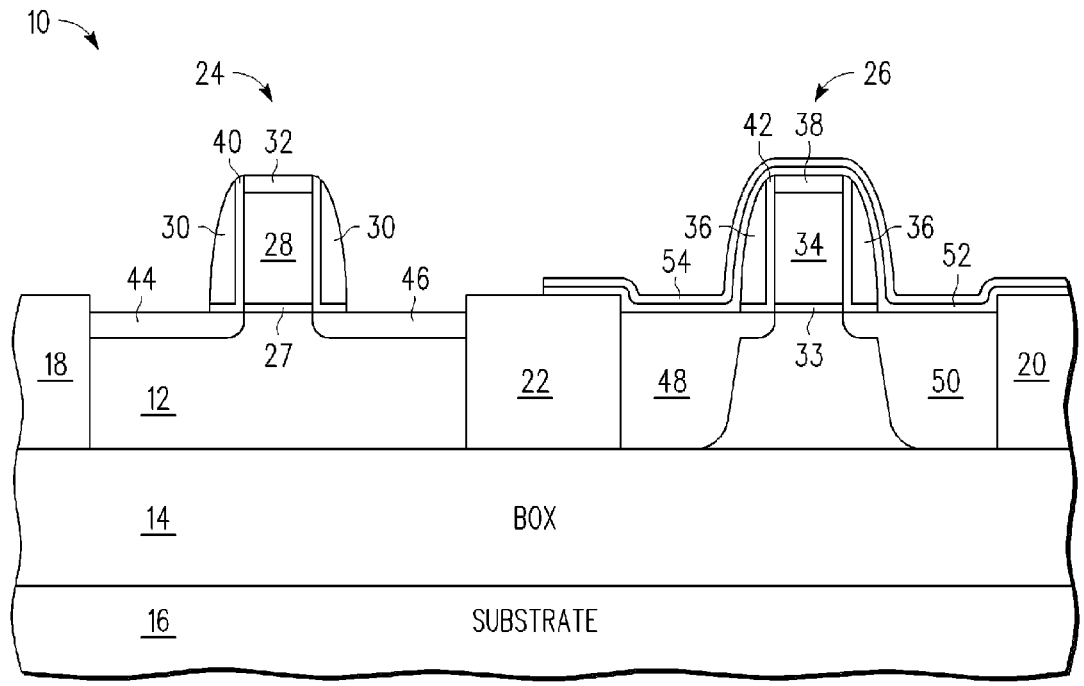
FIG. 7 is a view of a semiconductor device during a processing step.

Next, as shown in FIG. 7, epi hard mask 52 overlying the p-channel device may be removed. By way of example, a hydrochloric (HCl) gas ambient cleaning process at 650 degrees Celsius may be used to remove epi hard mask 52 overlying the p-channel device. As part of this cleaning step, a Rapid Thermal Anneal process may be performed for 10 seconds to 30 seconds. Other suitable etching techniques can also be used to remove epi hard mask 52 overlying the p-channel device.

Figure 8:
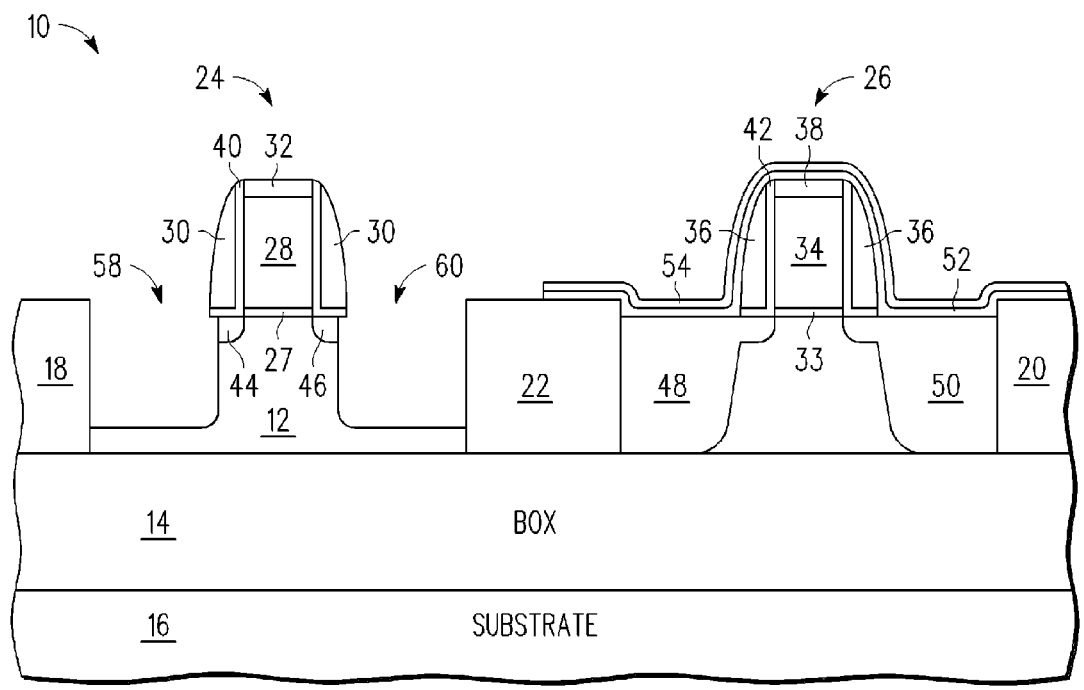
FIG. 8 is a view of a semiconductor device during a processing step.

Next, as shown in FIG. 8, source/drain recesses 58, 60 may be formed as part of the p-channel device. By way of example, source/drain recesses 58, 60 may be formed using a dry etch process. Alternatively, a combination of wet and dry etch processes may also be used. As part of this step, source/drain recesses may have an etch depth of 300 Angstroms to 400 Angstroms.

Figure 9:
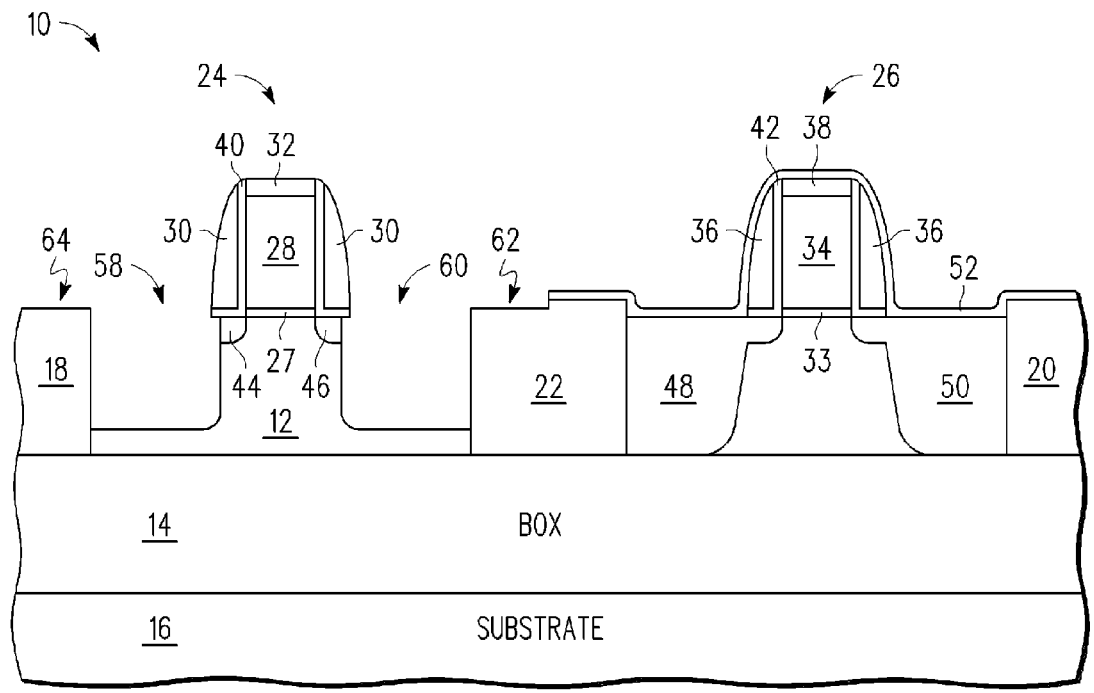
FIG. 9 is a view of a semiconductor device during a processing step.

Next, as shown in FIG. 9, an epi-clean step may be performed. As part of this step, native oxide may be removed from source/drain recesses 58, 60. Epi-clean may be performed using an HF clean process. The epi-clean step may also result in complete or partial removal of the hard mask 54 in a region overlying the n-channel device. Moreover, the epi-clean step may also cause removal of a top portion of isolation regions 18 and 22, as shown by reference numerals 62 and 64. Since a part of the isolation region 22 is covered by epi-hard mask 52, the top portion of this covered part may not be removed. Although FIG. 9 does not show an adjacent n-channel device to the left of the p-channel device in region 24, there will be another n-channel device on the left side of the p-channel device. Thus, only a part of isolation region 18 would be exposed to the epi-clean step. By way of example, a top portion having a height of approximately 50 Angstroms to 100 Angstroms may be removed from the exposed part of isolation region 18 and the exposed part of isolation region 22.

Figure 10:
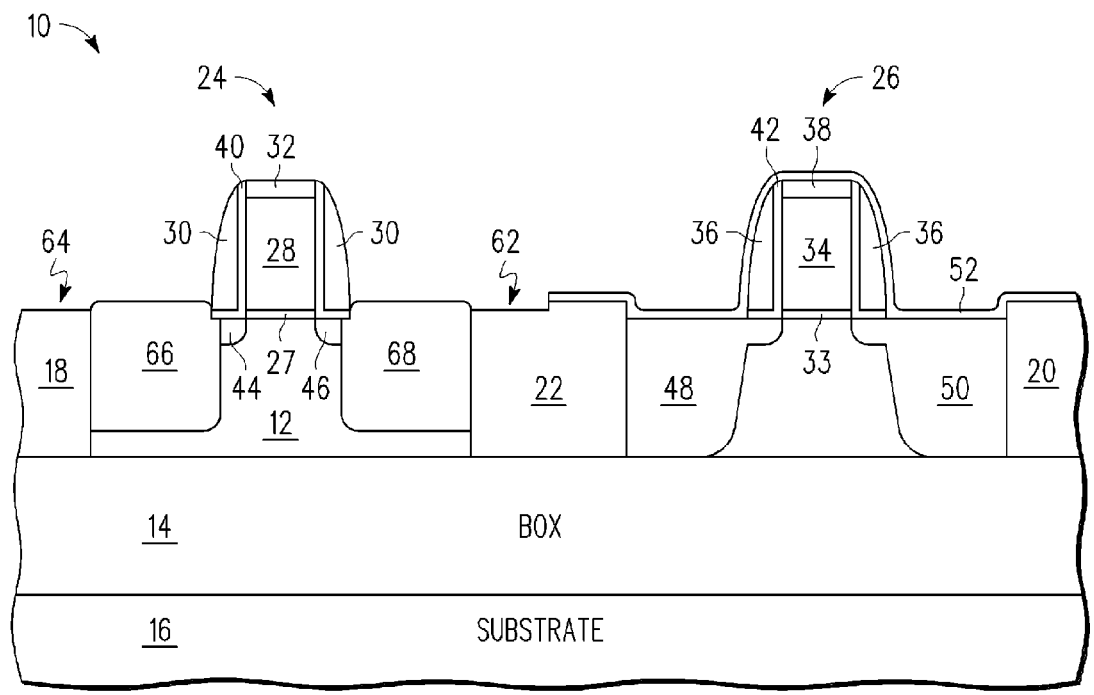
FIG. 10 is a view of a semiconductor device during a processing step.

Next, as shown in FIG. 10, source/drain 66, 68 may be epitaxially grown in recesses 58, 60. By way of example, in-situ boron doped silicon germanium source/drain may be grown over semiconductor material layer 12. For example, boron doping concentration may range for $1e20/cm^3$ to $1e21/cm^3$. For example, germanium atomic content may range from 20-40%.

Figure 11:
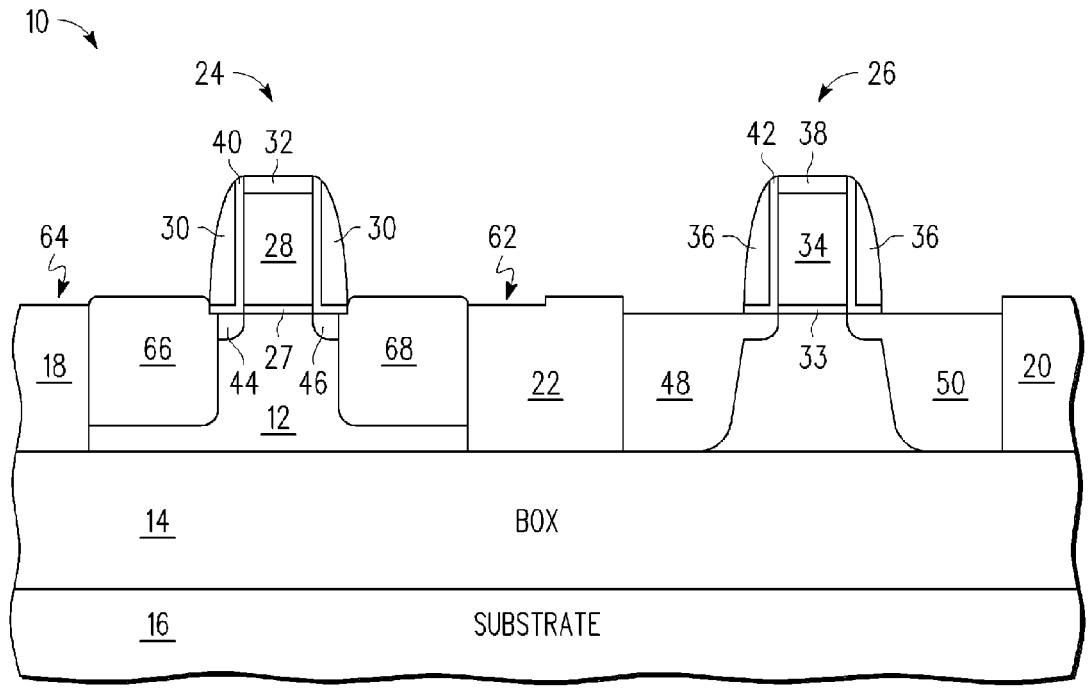
FIG. 11 is a view of a semiconductor device during a processing step.

Next, as shown in FIG. 11, the remaining portion of epi hard mask 52 overlying the n-channel device may be removed. By way of example, a hydrochloric (HCl) gas ambient cleaning process at 650 degrees Celsius may be used to remove the remaining portion of epi hard mask 52 overlying the n-channel device. As part of this cleaning step, a Rapid Thermal Anneal process may be performed for 10 seconds to 30 seconds. Other suitable etching techniques can also be used to remove the remaining portion of epi hard mask 52 overlying the n-channel device. Because as part of this cleaning step no hydrofluoric acid is used, the oxide in the isolation regions is not consumed. This ensures better stress alignment with the etch stop layers that are formed later. Minimizing field oxide loss also mitigates any adverse impact to stress induced from the isolation regions. Similarly, because as part of this step, no hydrofluoric acid is used, no part of spacers 30 and 36 is consumed.

Figure 12:
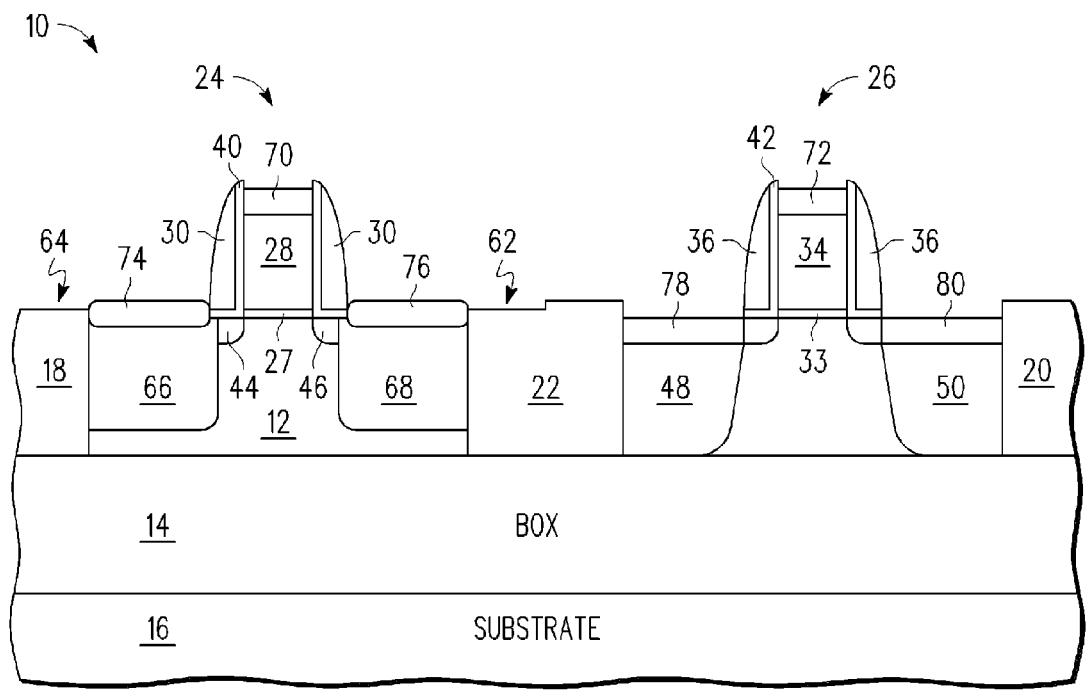
FIG. 12 is a view of a semiconductor device during a processing step.

Next, as shown in FIG. 12, capping layers 32 and 38 may be removed. Prior to removing capping layers 32 and 38 any liner present on top of gate electrodes 28 and 34 may be removed. Next, silicide regions 70, 72, 74, 76, 78, and 80 may be formed. Silicide regions 70, 72, 74, 76, 78, and 80 may be formed using Nickel, Nickel Platinum alloy, or other suitable materials.

Figure 13:
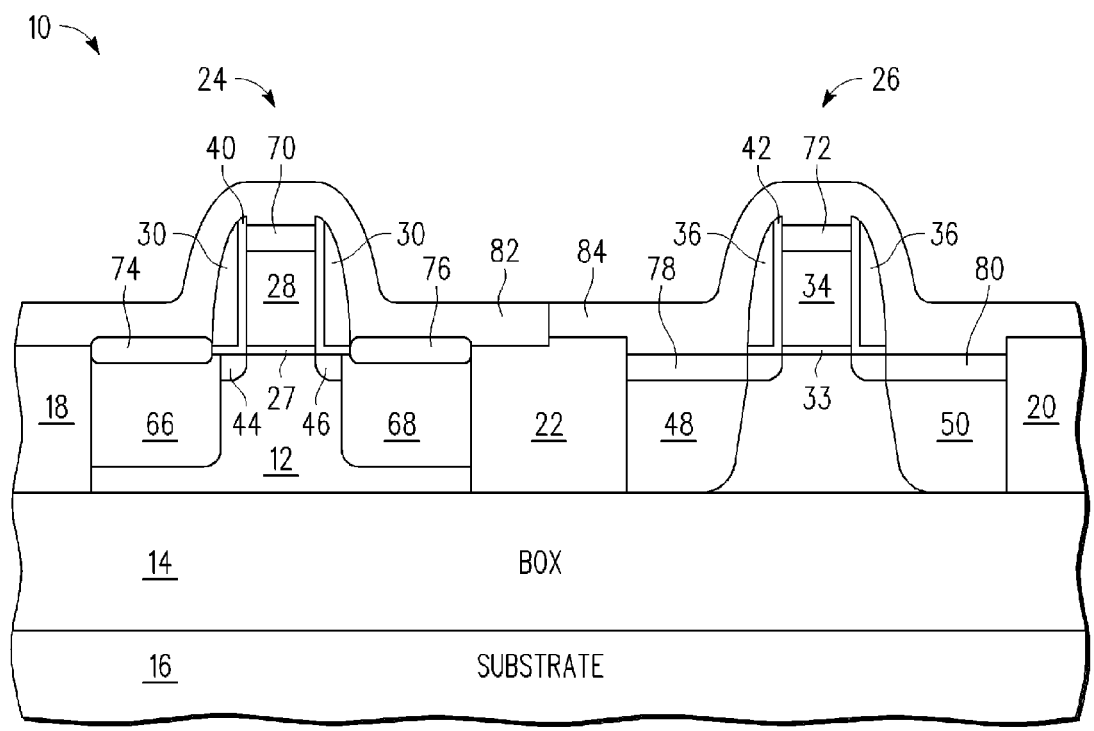
FIG. 13 is a view of a semiconductor device during a processing step.

Next, as shown in FIG. 13, etch stop layer 82 may be formed over the p-channel device. Etch stop layer 82 may be formed using a material that would exert compressive stress into the channel of the p-channel devices. Etch stop layer 84 may be formed over the n-channel devices. Etch stop layer 84 may be formed using a material that would exert tensile stress into the channel of the n-channel devices. Etch stop layers 82 and 84 may be formed using nitride.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, although an embodiment relating to a p-channel device having recessed source/drain regions is illustrated, an n-channel device having recessed source/drain regions may also be formed using a similar process. In case of an n-channel device having recessed source/drain regions, in-situ n-type doped silicon carbon (SiC) may be epitaxially grown in the source/drain recesses. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method of making a semiconductor device structure on a semiconductor substrate having a semiconductor layer having isolation regions, comprising:
   forming a first gate structure over a first region of the semiconductor layer and a second gate structure over a second region of the semiconductor layer;
   forming sidewall spacers along sidewalls of the first and second gates;
   forming a first insulating layer over the first and second regions in which the first insulating layer can function as a mask during an etch of the semiconductor layer and can be removed selective to the isolation regions and the sidewall spacers;
   forming a second insulating layer over the first insulating layer;
   patterning the second insulating layer to leave a remaining portion of the second insulating layer over the second region;
   removing the first insulating layer from over the first region to leave a remaining portion of the first insulating layer over the second region;
   recessing the semiconductor layer in the first region adjacent to the first gate to form recesses;
   epitaxially growing a semiconductor material in the recesses;
   removing the remaining portion of the first insulating layer; and
   using the remaining portion of the second insulating layer as a hard mask in the step of removing the first insulating layer.

2. The method of claim 1, wherein the step of forming the first insulating is further characterized by the first insulating layer comprising a material having a dielectric constant greater than that of the sidewall spacers.

3. The method of claim 2, wherein the step of forming the first insulating is further characterized by the first insulating layer comprising a metal oxide.

4. The method of claim 1 further comprising:
   forming a photoresist layer over the second insulating layer;
   patterning the photoresist layer to leave a remaining portion of the photoresist layer over the second region; and
   removing the photoresist layer after the step of patterning the second insulating layer and before the step of removing the first insulating layer.

5. The method of claim 1, wherein:
   the step of forming the second insulating layer is further characterized by the second insulating layer comprising silicon oxide; and
   the step of forming the first insulating layer is further characterized by the first insulating layer comprising hafnium and oxygen or hafnium, zirconium, and oxygen.

6. The method of claim 1 further comprising forming a first stressor layer over the first gate and second stressor, which has a stress type different from that of the first stressor, over the second gate.

7. The method of claim 1, wherein the step of epitaxially growing is further characterized by the material comprising one of group consisting of silicon germanium and silicon carbon.

8. The method of claim 1, wherein the step of epitaxially growing is further characterized by the material comprising silicon germanium that is in-situ doped to P type.

9. The method of claim 1, wherein the step of removing the first insulating layer is performed at a temperature in excess of 500 degrees Celsius.

10. The method of claim 1, wherein the step of removing the first insulating layer is performed using a hydrochloric gas ambient cleaning process.

11. The method of claim 10 further comprising performing a rapid thermal anneal subsequent to the step of removing the first insulating layer.

12. A method of making a semiconductor device structure on a semiconductor substrate having a silicon layer having isolation regions comprising silicon oxide, comprising:
 forming a first gate structure over a first region of the silicon layer and a second gate structure over a second region of the silicon layer wherein the first region is for forming a transistor type different from a transistor type formed in the second region;
 forming nitride sidewall spacers along sidewalls of the first and second gates;
 forming a first insulating layer over the first and second regions in which silicon can be etched selective to the first insulating layer and the first insulating layer can be etched selective to silicon oxide and nitride;
 removing the first insulating layer from over the first region to leave a remaining portion of the first insulating layer over the second region;
 recessing the semiconductor layer in the first region adjacent to the first gate to form recesses;
 epitaxially growing a semiconductor material comprising one of a group consisting of silicon carbon and silicon germanium in the recesses;
 removing the remaining portion of the first insulating layer;
 forming an oxide layer over the first insulating layer;
 patterning the oxide layer prior to performing the step of removing the first insulating layer to form a patterned oxide layer; and
 etching the patterned oxide layer during a clean of the recesses prior to the step of epitaxially growing.

13. The method of claim 12 further comprising:
 forming a stressor having a first type of stress over the first region after the step of removing the remaining portion of the first insulating layer; and
 forming a stressor having a second type of stress different from the first type of stress over the second region after the step of removing the remaining portion of the first insulating layer.

* * * * *